Dec. 9, 1969 W. T. WAKELY 3,483,308

MODULAR PACKAGES FOR SEMICONDUCTOR DEVICES

Filed Oct. 24, 1968 2 Sheets-Sheet 1

INVENTOR
WILBUR T. WAKELY

Jerry W. Mills

ATTORNEY

INVENTOR
WILBUR T. WAKELY

Jerry W. Mills
ATTORNEY

United States Patent Office 3,483,308

Patented Dec. 9, 1969

3,483,308

MODULAR PACKAGES FOR SEMICONDUCTOR DEVICES

Wilbur T. Wakely, Dallas, Tex., assignor to Texas Instruments Incorporated, Dallas, Tex., a corporation of Delaware Filed Oct. 24, 1968, Ser. No. 770,276
Int. Cl. H05k 1/10
U.S. Cl. 174—52 10 Claims

ABSTRACT OF THE DISCLOSURE

A package for connecting miniaturized electronic components to a printed circuit board is constructed from a rectangular body of insulating material having generally flat upper and lower surfaces. A plurality of pedestals of insulating material extend downwardly from the lower surface of the rectangular body, with conductive metal layers being disposed on the bottom of the pedestals. A number of discrete metallized areas are disposed on the upper surface of the rectangular body for connection to miniaturized electronic components. In one embodiment, conductive strips extend around the edges of the rectangular body to connect the discrete metallized areas on the upper surface to the metal layers on the pedestal bottoms. In another embodiment, connecting leads extend through the rectangular body and the pedestals to connect the discrete metallized areas with the metal layers on the pedestal bottoms.

This invention relates to miniaturized electronic components, and more particularly to packages for miniaturized semiconductor components for connection into hybrid circuits.

Miniaturized integrated circuits have been heretofore developed which must be connected in a suitable package, commonly termed a header, prior to attachment into a printed circuit board or other hybrid circuit. Such headers are necessary because of the extremely small size of the miniature electronic components in relationship to the connection areas on the printed circuit board. The miniature electronic components may range from a single transistor up to more complex circuitry including a number of active and passive devices.

A number of various techniques have been heretofore developed for mounting miniaturized electronic components for connection to a printed circuit board. For example, the underside of a block of ceramic material has been machined to form a header having a plurality of pedestals or posts extending from the body, with a flat area between the posts. The posts are metallized on the ends thereof. The miniaturized electronic circuit is disposed in the flat area between the posts, and small jumper wires are bonded between the metallized post ends and terminals of the miniaturized electronic circuit. The header is then inverted and the metallized post ends are bonded to the hybrid circuit to secure the header in place and to electrically contact the miniaturized electronic circuit into the hybrid circuit. Such inverted headers hide the miniaturized electronic circuit upon connection into the hybrid circuit, thereby presenting problems in maintenance and testing of the miniaturized electronic circuits. Additionally, such inverted headers generally require expensive precision machining and metallizing.

Headers have also been heretofore devised wherein miniaturized electronic components are connected on the upper surface of an insulating header body, with a plurality of flexible metal leads connected to the electronic components and extending horizontally from the header body. The metal leads are bent and then connected to a printed circuit board. Problems sometimes arise due to the relatively high temperatures required to connect the metal leads to the hybrid circuit. The flexible leads present problems in manufacture and in subsequent handling of the header, as the leads tend to bend out of shape and sometimes break. Further, such flexible leads sometimes require the defining of holes in the printed circuit board.

Leadless headers have been heretofore developed wherein a miniaturized electronic circuit is mounted on the upper surface of a ceramic header and attached to discrete metallized layers on the upper surface of the ceramic header. Stiff wires are connected at one end to the metallized layers and are passed through the ceramic header to extend vertically for some distance from the bottom of the header. The ends of the wires are then soldered to a printed circuit board. A substantial amount of heat is required to fix such headers on the printed circuit board. Further, problems have arisen by solder flux being trapped between the exposed downwardly extending wires, thus causing shorts and maintenance problems. Additionally, such headers have generally required that the upper metallized areas are of the same type of metal as the vertically extending wires, thereby necessitating a compromise between desired conductive properties and the provision of good solder joints.

In accordance with the present invention, a package for miniaturized electronic components includes a body of insulating material having upper and lower generally planar surfaces. A plurality of insulating pedestals extend downwardly from the lower surface of the body in a spaced apart configuration. Metallized films are disposed on the bottoms of each of the pedestals. Discrete metallized areas are disposed on the upper surface of the body for connection to the electronic components. Conductive paths connect the discrete metallized areas with the metallized films on the bottoms of the pedestals.

In a more specific aspect of the invention, a rectangular body formed from insulating material is provided with a plurality of downwardly extending pedestals each having a metallized layer on the bottom portion thereof. The upper surface of the rectangular body is provided with a plurality of discrete metallized areas for connection to a miniaturized electronic circuit. Conductive strips extend from the discrete metallized areas around the edges of the rectangular body to the metallized layers on the pedestals. In another embodiment of the invention, conductive paths extend through the rectangular body and the pedestals to connect the discrete metallized areas with the metallized pedestal bottoms. The metal utilized for the upper metallized areas may be different than the metal utilized for the pedestal bottoms to provide optimum connections to miniaturized electronic circuits and to the printed circuit board.

For a more complete understanding of the present invention and for further objects and advantages thereof, reference is now made to the following description taken in conjunction with the accompanying drawings, in which.

Figures 1, 2:
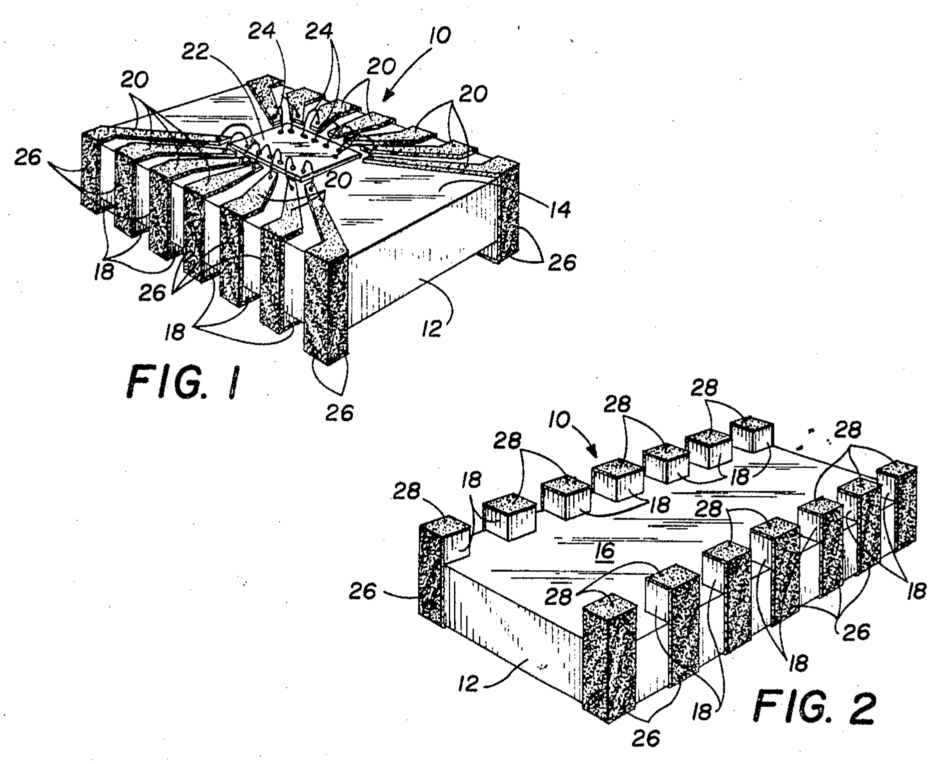
FIGURE 1 illustrates a perspective view of the upper portion of the header according to the invention.
FIGURE 2 illustrates a perspective view of the bottom surface of the header shown in FIGURE 1.

Referring to the drawings, FIGURES 1 and 2 illustrate one embodiment of the package, or header designated generally by the numeral 10. Header 10 comprises a rectangular body 12 constructed from an insulating material such as plastic, glass or ceramic material. The upper surface 14 of the body 12 is generally planar. As shown in FIGURE 2, the lower surface 16 of the body 12 includes a generally planar central portion, with a plurality of pedestal members 18 integrally extending from the edges of the lower surface 16. In this embodiment of the header the pedestal members 18 have a square cross section and are symmetrically spaced along the sides of the body 12 in two linear rows.

The rectangular body 12 with the integral pedestal members 18 may be formed by a number of conventional techniques. For example, the body 12 may be molded using a conventional Dorst press from a conventional alumina ceramic material using conventional ceramic molding techniques. After the ceramic material has been pressed into the form of body 12 by the Dorst press, the body 12 is fired using conventional ceramic techniques.

A plurality of discrete metallized leads 20 are defined on the upper surface 14. It will be understood that the configuration of the leads 20 will be changed for various connection requirements. The miniaturized electronic circuit 22 is disposed in the central portion of the upper surface 14, and small jumper wires 24 connect the ends of the leads 20 to the terminals of the miniaturized circuit 22. The miniaturized circuit 22 may comprise a plurality of active and passive elements, or may comprise only a single transistor or the like. The number of pedestal members 18 utilized will vary according to the number of output terminals from the miniaturized circuit 22.

Conductive strips 26 extend from the outer ends of the leads 20 down the edge portions of the rectangular body 12 to the bottoms of the pedestal members 18. The bottoms of each of the pedestal members 18 are coated with a metallized film 28. In the completed header assembly, a conductive path thus exists from each terminal of the miniaturized circuit 22 via the jumper wires 24, the leads 20 and conductive strips 26 to the conductive films 28 on the bottom of each pedestal.

The metallized areas may be applied to the header by any one of a number of conventional techniques. For example, the conventional molybdenum-manganese process for metallizing ceramic may be used. In that process, finely ground molybdenum-manganese metal in a suitable liquid binder is applied to a surface exposed through a mask. The mask is then removed and the molybdenum-manganese coat is fired at high temperature to form a metal film which is strongly adherent to the surface of the ceramic material. Successive layers of other metals such as nickel, silver and gold may be deposited by electroplating to ultimately provide a layer of soft metal at the outer surface of the metal film 28 for ease of welding or soldering to the printed circuit board.

Alternatively, low temperature conductive paste may be applied to the body 12 in the desired configuration and then fired onto the ceramic body. This low temperature process will eliminate much of the cost of the relatively expensive molybdenum-manganese processing. In some instances it will be desirable to encapsulate the circuit 22 in a suitable material such as epoxy or other plastic to protect the circuit during subsequent handling and use.

Figure 3:
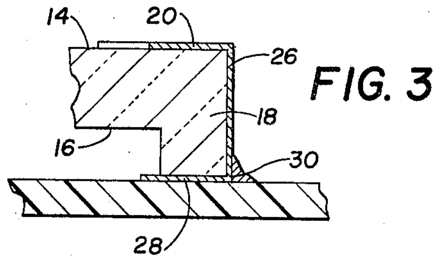
FIGURE 3 is a sectional view of one of the pedestals of the header of FIGURE 1 shown connected to a printed circuit board.
Figure 4:
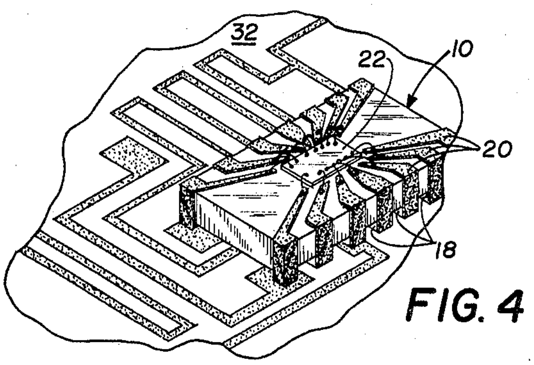
FIGURE 4 is a perspective view of the header shown in FIGURE 1 connected to a printed circuit board.

As shown in FIGURES 3 and 4, after the miniaturized circuit 22 has been affixed to the upper surface of the header 10, the header 10 may be connected to a printed circuit board. Any suitable technique may be utilized to connect the header to the printed circuit board, such as solder reflow techniques with hot air guns. Alternatively, conventional ultrasonic welding techniques may be used.

As seen in FIGURE 3, one of the advantages of the invention is that a good solder fillet 30 may be visually seen after the header has been attached.

As shown in FIGURE 4 the pedestal members 18 support the lower surface 16 of the header above the surface of the printed circuit board 32. This prevents flux from the soldering operation being trapped underneath the header, as the flux and other accumulated material may be easily flushed from beneath the header 10 by a flow of liquid or the like. Additionally, the pedestal members 18 provide a convenient means for properly orienting the header upon the printed circuit board prior to attachment.

FIGURES 5–8 illustrate another embodiment of a header constructed in accordance with the invention. The header comprises a rectangular body 40 of insulating material, with generally planar upper and lower surfaces. On the upper surface of the body 40, a plurality of discrete metallized leads 42 are deposited by any of the conventional processes previously described. The particular configuration of the leads 42 will vary according to the number and position of the terminals of the miniaturized electronic circuit mounted on the header. A miniaturized electronic circuit 44 is deposited on the center portion of the upper surface of the body 40. Jumper leads 46 are bonded between the circuit 44 and respective ones of the leads 42.

Figures 5, 6:
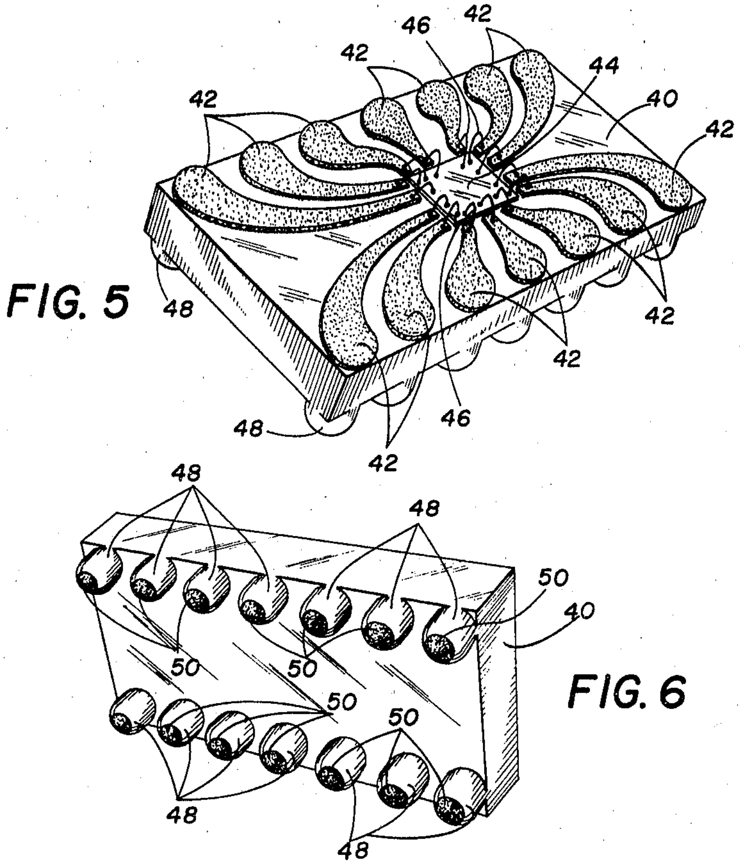
FIGURE 5 is a perspective view of the upper surface of another embodiment of the header according to the invention.
FIGURE 6 is a perspective view of the bottom of the header shown in FIGURE 5.

As best shown in FIGURE 6, a plurality of pedestal members 48 depend downwardly from the lower surface of the body 40. Pedestal members 48 are preferably integral with body 40. The cross section of each of the pedestal members 48 is circular, but it will be understood that for other applications the cross section may be rectangular or the like. The bottom ends of the pedestal members 48 may be rounded in order to provide a relatively small contact area with the printed circuit board. Metallized areas 50 are deposited on the bottom of each of the pedestal members 48 to facilitate connection of the header to the printed circuit board.

Figure 7:
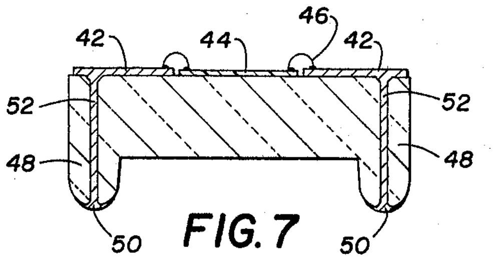
FIGURE 7 is a cross-sectional view of a portion of the header shown in FIGURE 5.
Figure 8:
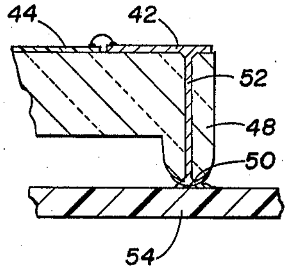
FIGURE 8 is a sectional view of one of the pedestals of the header of FIGURE 5 when attached to a printed circuit board.

As best shown in FIGURE 7, conductive paths 52 extend through the body 40 and through each of the pedestal members 48 to electrically connect the leads 42 with the metallized areas 50. As shown in FIGURE 8, the header is connected to a printed circuit board 54 by placing the header on the board and welding, or otherwise affixing, the bottom of each pedestal member 48 to the printed circuit board. The header may advantageously be attached to the printed circuit board by solder reflow techniques utilizing hot gas guns. Alternatively, in some instances it may be desired to preheat the header by an external source and then merely press the header down on the printed circuit board. Infrared heating may also be utilized to solder the header to the printed circuit board.

In construction of the header shown in FIGURES 5–8, the body 40 may be pressed from ceramic with a Dorst press and then fired as previously described. Suitable holes are then drilled through the body 40 and each of the pedestal members 48. The holes are then filled with a suitable metal wire, or molten metal is flowed through the holes, to form conductive paths 52. The discrete leads 42 and the metallized areas 50 are applied by any of the previously described techniques. The metallized areas 50 are then subjected to coating procedures such as a hot tin dip in order to facilitate soldering of the header to the printed circuit board.

The present headers thus provide packages for securely attaching miniaturized circuits into hybrid circuits while positioning the miniaturized circuits for ease of testing and rework. The insulating pedestals depending from the headers enable easy attachment to printed circuit boards, with the resulting joints visually exposed for inspection. The pedestal members also allow flux from the soldering techniques to be easily flushed out. The leadless nature of the present headers eliminates many of the problems previously present wtih headers having flexible leads. The present headers are easily handled, inexpensively constructed and are readily adaptable for production line manufacture.

Whereas the present invention has been described with respect to several specific embodiments thereof, it is to be understood that various modifications and changes may be suggested by one skilled in the art and it is desired to encompass such changes and modifications.

What is claimed is:

1. A package for electronic components comprising:
a body of insulating material having upper and lower generally planar surfaces,
a plurality of insulating pedestal members extending downwardly from said lower surface in a spaced apart configuration,
metal films disposed on the ends of each of said pedestal members,
discrete metallized leads disposed on said upper surface for connection to said electronic components, and
conductive paths connecting said discrete metallized leads to said metal films.

2. The package of claim 1 wherein said conductive paths extend around the edges of said body.

3. The package of claim 1 wherein said conductive paths extend through said body.

4. The package of claim 1 wherein the sectional configuration of said pedestal members is generally circular.

5. The package of claim 1 wherein the sectional configuration of said pedestal members is generally rectangular.

6. The package of claim 1 wherein said metal films and said metallized leads are constructed from different metals.

7. A header for connecting electronic components to a printed circuit board comprising:
a rectangular body of insulating material having generally flat upper and lower surfaces,
a plurality of insulating projections downwardly extending from said lower surface,
conductive surfaces on said upper surface for connection to said electrical components and extending to the ends of said insulating projections for connection to said printed circuit board.

8. The header of claim 7 wherein said conductive surfaces extend through holes in said body.

9. The header of claim 7 wherein said conductive surfaces extend around the sides of said body.

10. The header of claim 7 wherein said insulating projections are linearly disposed along the edge portions of the lower surface of said rectangular body.

References Cited

UNITED STATES PATENTS 3,374,533 3/1968 Burks et al.
3,404,214 10/1968 Elliott.

DARRELL L. CLAY, Primary Examiner

U.S. Cl. X.R.

29—626, 589; 317—101, 234